United States Patent
Lee et al.

(10) Patent No.: US 8,338,245 B2
(45) Date of Patent: Dec. 25, 2012

(54) INTEGRATED CIRCUIT SYSTEM EMPLOYING STRESS-ENGINEERED SPACERS

(75) Inventors: Jae Gon Lee, Singapore (SG); Jong Ho Yang, New York, NY (US); Victor Chan, Newburgh, NY (US); Jun Jung Kim, Gyeonggi-do (KR)

(73) Assignees: GLOBALFOUNDRIES Singapore Pte. Ltd., Singapore (SG); Samsung Electronics Co., Ltd., Gyeonggi-Do (KR); International Business Machines Corporation, Armonk, NY (US)

( * ) Notice: Subject to any disclaimer, the term of this patent is extended or adjusted under 35 U.S.C. 154(b) by 462 days.

(21) Appl. No.: 12/048,994

(22) Filed: Mar. 14, 2008

(65) Prior Publication Data
US 2008/0173934 A1    Jul. 24, 2008

Related U.S. Application Data

(63) Continuation-in-part of application No. 11/611,126, filed on Dec. 14, 2006, now abandoned.

(51) Int. Cl.
*H01L 21/8238* (2006.01)
(52) U.S. Cl. .. 438/210; 438/238; 438/382; 257/E21.004
(58) Field of Classification Search ............... 438/199, 438/200, 210, 238, 382, 384, 595, 519, 521; 257/E21.004, E21.626, E21.64
See application file for complete search history.

(56) References Cited

U.S. PATENT DOCUMENTS

| | | | | |
|---|---|---|---|---|
| 6,180,462 B1 * | 1/2001 | Hsu | ............. | 438/275 |
| 6,436,747 B1 * | 8/2002 | Segawa et al. | ............. | 438/197 |
| 6,548,389 B2 * | 4/2003 | Moriwaki et al. | ............. | 438/592 |
| 6,621,131 B2 * | 9/2003 | Murthy et al. | ............. | 257/408 |
| 6,864,135 B2 * | 3/2005 | Grudowski et al. | ............. | 438/230 |
| 7,132,704 B2 * | 11/2006 | Grudowski | ............. | 257/288 |
| 7,164,189 B2 * | 1/2007 | Huang et al. | ............. | 257/632 |
| 7,235,469 B2 * | 6/2007 | Okayama et al. | ............. | 438/517 |
| 7,256,084 B2 | 8/2007 | Lim et al. | | |
| 7,314,793 B2 | 1/2008 | Frohberg et al. | | |
| 7,338,876 B2 * | 3/2008 | Okonogi et al. | ............. | 438/369 |
| 7,390,711 B2 * | 6/2008 | Byun | ............. | 438/231 |
| 7,538,397 B2 * | 5/2009 | Kotani | ............. | 257/380 |
| 7,585,739 B2 * | 9/2009 | Saiki et al. | ............. | 438/306 |
| 7,608,499 B2 * | 10/2009 | Romero et al. | ............. | 438/199 |
| 2004/0248358 A1 * | 12/2004 | Komori | ............. | 438/238 |
| 2005/0112817 A1 * | 5/2005 | Cheng et al. | ............. | 438/219 |

(Continued)

OTHER PUBLICATIONS

"Polysilicon," Feb. 2, 2007, SiliconFarEast, http://www.siliconfareast.com/polysilicon.htm, pp. 1.*

*Primary Examiner* — Matthew Landau
*Assistant Examiner* — Joseph C Nicely
(74) *Attorney, Agent, or Firm* — Ishimaru & Associates LLP; Mikio Ishimaru; Stanley M. Chang (57) ABSTRACT

An integrated circuit system that includes: providing a substrate including a first region with a first device and a second device and a second region with a resistance device; configuring the first device, the second device, and the resistance device to include a first spacer and a second spacer; forming a stress inducing layer over the first region and the second region; processing at least a portion of the stress inducing layer formed over the first region to alter the stress within the stress inducing layer; and forming a third spacer adjacent the second spacer of the first device and the second device from the stress inducing layer.

10 Claims, 6 Drawing Sheets

U.S. PATENT DOCUMENTS

| | | | |
|---|---|---|---|
| 2006/0003520 A1* | 1/2006 | Huang et al. | 438/222 |
| 2006/0121640 A1* | 6/2006 | Kim | 438/57 |
| 2006/0246641 A1 | 11/2006 | Kammler et al. | |
| 2006/0261416 A1 | 11/2006 | Hachimine | |
| 2007/0090417 A1* | 4/2007 | Kudo | 257/288 |
| 2007/0096183 A1* | 5/2007 | Ogawa et al. | 257/300 |
| 2008/0261355 A1* | 10/2008 | Goktepeli et al. | 438/154 |
| 2008/0280406 A1* | 11/2008 | Ema et al. | 438/210 |
| 2009/0004791 A1* | 1/2009 | Madurawe | 438/199 |
| 2010/0178740 A1* | 7/2010 | Kohli | 438/236 |

* cited by examiner

INTEGRATED CIRCUIT SYSTEM EMPLOYING STRESS-ENGINEERED SPACERS

CROSS-REFERENCE TO RELATED APPLICATION(S)

This is a continuation-in-part of co-pending U.S. patent application Ser. No. 11/611,126 filed Dec. 14, 2006.

The present application contains subject matter related to co-pending U.S. patent application Ser. No. 11/611,126. The related application is assigned to Chartered Semiconductor Manufacturing Ltd.

The present application contains subject matter related to co-pending U.S. patent application Ser. No. 11/618,453. The related application is assigned to Chartered Semiconductor Manufacturing Ltd. and International Business Machines Corporation.

TECHNICAL FIELD

The present invention relates generally to integrated circuits, and more particularly to an integrated circuit system employing stress-engineered spacers.

BACKGROUND ART

Integrated circuits find application in many of today's consumer electronics, such as cell phones, video cameras, portable music players, printers, computers, etc. Integrated circuits may include a combination of active devices, passive devices and their interconnections.

Active devices, such as a metal-oxide-semiconductor field-effect transistor (MOSFET), generally include a semiconductor substrate, having a source, a drain, and a channel located between the source and drain. A gate stack composed of a conductive material (i.e.—a gate) and an oxide layer (i.e.—a gate oxide) are typically located directly above the channel. During operation, an inversion layer forms a conducting bridge or "channel" between the source and drain when a voltage is applied to the gate. Both p-channel and n-channel MOSFET technologies are available and can be combined on a single substrate in one technology, called complementary-metal-oxide-semiconductor or CMOS.

Scaling of the MOSFET, whether by itself or in a CMOS configuration, has become a major challenge for the semiconductor industry. Size reduction of the integral parts of a MOSFET has lead to improvements in device operation speed and packing density, but size reduction has its limits. For example, as scaling of the MOSFET reaches the submicron era, intended and unintended strain effects can become a design problem. Consequently, new methods must be developed to maintain the expected device performance enhancement from one generation of devices to the next.

Generally, the amount of current that flows through the channel of a transistor is directly proportional to the mobility of carriers within the channel region. Consequently, the higher the mobility of the carriers in the transistor channel, the more current that can flow through the device and the faster it can operate. One way to increase the mobility of carriers in the channel of a transistor is to manufacture the transistor with a strained channel. Depending upon the type of strained channel, significant carrier mobility enhancement has been reported for both electrons and holes. Commonly, a compressively strained channel exhibits enhanced hole mobility and a tensile strained channel exhibits enhanced electron mobility.

Conventional techniques employed to affect strain within the channel region of a MOSFET may include: forming shallow trench isolation structures or depositing etch stop layers. Each of these techniques can be engineered to promote appropriate mechanical strain within the channel region. Unfortunately, some conventional MOSFET formation techniques can degrade device performance. For example, a reduced resistance silicide electrical contact formed over a source/drain region may produce a disadvantageous strain within a channel, thereby degrading device performance. Furthermore, some conventional processing steps may displace a strain inducing layer too far from a channel region, thereby reducing its efficacy for promoting carrier mobility.

Thus, a need still remains for a reliable integrated circuit system and method of fabrication, wherein the integrated circuit system exhibits improved carrier mobility due to the controlled application of stress to the channel of an active device. In view of the ever-increasing commercial competitive pressures, increasing consumer expectations, and diminishing opportunities for meaningful product differentiation in the marketplace, it is increasingly critical that answers be found to these problems. Moreover, the ever-increasing need to save costs, improve efficiencies, and meet such competitive pressures adds even greater urgency to the critical necessity that answers be found to these problems.

Solutions to these problems have been long sought but prior developments have not taught or suggested any solutions and, thus, solutions to these problems have long eluded those skilled in the art.

DISCLOSURE OF THE INVENTION

The present invention provides an integrated circuit system including: providing a substrate including a first region with a first device and a second device and a second region with a resistance device; configuring the first device, the second device, and the resistance device to include a first spacer and a second spacer; forming a stress inducing layer over the first region and the second region; processing at least a portion of the stress inducing layer formed over the first region to alter the stress within the stress inducing layer; and forming a third spacer adjacent the second spacer of the first device and the second device from the stress inducing layer.

Certain embodiments of the invention have other advantages in addition to or in place of those mentioned above. The advantages will become apparent to those skilled in the art from a reading of the following detailed description when taken with reference to the accompanying drawings.

BEST MODE FOR CARRYING OUT THE INVENTION

The following embodiments are described in sufficient detail to enable those skilled in the art to make and use the invention. It is to be understood that other embodiments would be evident based on the present disclosure, and that process or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail.

Likewise, the drawings showing embodiments of the system are semi-diagrammatic and not to scale and, particularly, some of the dimensions are for the clarity of presentation and are shown exaggerated in the drawing FIGs. Additionally, where multiple embodiments are disclosed and described having some features in common, for clarity and ease of illustration, description, and comprehension thereof, similar and like features one to another will ordinarily be described with like reference numerals.

The term "horizontal" as used herein is defined as a plane parallel to the conventional plane or surface of the substrate, regardless of its orientation. The term "vertical" refers to a direction perpendicular to the horizontal as just defined. Terms, such as "on", "above", "below", "bottom", "top", "side" (as in "sidewall"), "higher", "lower", "upper", "over", and "under", are defined with respect to the horizontal plane.

The term "processing" as used herein includes deposition of material or photoresist, patterning, exposure, development, implanting, etching, cleaning, and/or removal of the material or photoresist as required in forming a described structure.

The terms "example" or "exemplary" are used herein to mean serving as an instance or illustration. Any aspect or embodiment described herein as an "example" or as "exemplary" is not necessarily to be construed as preferred or advantageous over other aspects, embodiments, or designs.

The terms "first", "second", and "third" as used herein are for purposes of differentiation between elements only and are not to be construed as limiting the scope of the present invention.

The term "on" is used herein to mean there is direct contact among elements.

The term "system" as used herein means and refers to the method and to the apparatus of the present invention in accordance with the context in which the term is used.

The term "exhibiting the characteristics of stress memorization" as used herein includes a structure or element that has its physical properties affected by a stress inducing layer.

Generally, the following embodiments, described by FIGS. 1-10, manipulate the stresses created within a channel to maximize the performance of both NFET (n-channel Field-Effect-Transistor) and PFET (p-channel Field-Effect-Transistor) configurations through the use of differential spacers. The present inventors have found that strain engineered differential spacer design can maximize PFET performance by displacing a silicide electrical contact away from the PFET channel, where the silicide electrical contact reduces the net stress on the PFET channel, while preserving NFET performance by maintaining the proximity effect of a tensile stressed dielectric layer.

Although the present invention will discuss a first spacer design versus a first spacer and a second spacer design, it is not to be limited to such a narrow construction. The present invention more accurately encompasses a differential spacer design that is not distinguished by the number of spacers, but by the overall spacer thickness and its desired effect upon its intended target. For example, the present invention may discuss an NFET configuration with only a first spacer design, but may encompass an NFET configuration with more than one spacer, so long as the overall spacer thickness does not detrimentally alter the proximity effect of a subsequently deposited tensile dielectric layer. Furthermore, by way of example, the present invention may discuss a PFET configuration with a first spacer and a second spacer, but may encompass a PFET configuration with a single spacer design or a design with more than two spacers, wherein the overall PFET spacer thickness has been optimized to negate the detrimental effects of the low resistivity contact adjacent the PFET channel.

The following figures generally illustrate by way of example and not by limitation, an exemplary process for forming an integrated circuit system 100, and they are not to be construed as limiting.

Figure 1:
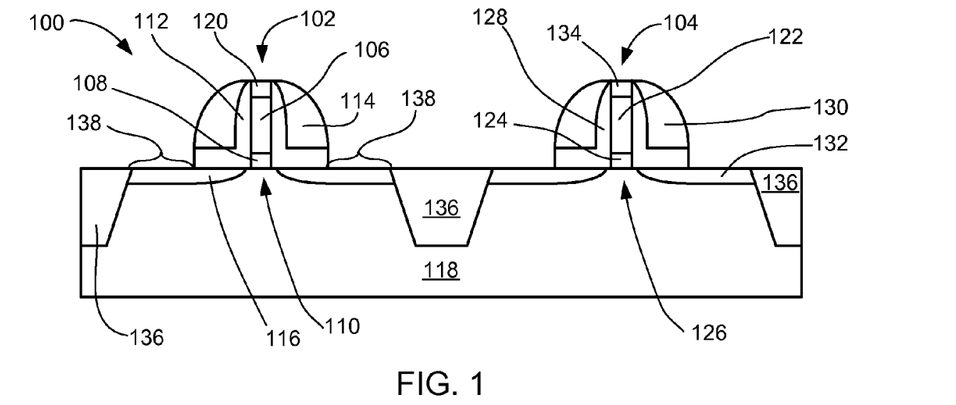
FIG. 1 is a cross sectional view of an integrated circuit system in an initial stage of manufacture in accordance with an embodiment of the present invention

Referring now to FIG. 1, therein is shown a cross sectional view of the integrated circuit system 100 in an initial stage of manufacture in accordance with an embodiment of the present invention. The integrated circuit system 100 can be formed from conventional deposition, patterning, photolithography, and etching to form an NFET device 102 and a PFET device 104. The NFET device 102 and the PFET device 104 may operate together, thereby forming a complementary metal-oxide-semiconductor (CMOS) configuration.

The NFET device 102 includes an NFET gate 106. Below the NFET gate 106 is an NFET gate oxide 108, and below the NFET gate oxide 108 is an NFET channel 110. Surrounding the NFET gate 106 is an NFET first liner 112, and surrounding the NFET first liner 112 is an NFET first spacer 114. By way of example, the NFET first liner 112 may be made from a material that includes oxygen and the NFET first spacer 114 may be made from a material that includes nitrogen. An NFET source/drain extension 116, formed by a low to medium-dose implant, extends from the NFET channel 110 in a substrate 118 to facilitate dimensional reductions for the scaling of the integrated circuit system 100. An NFET cap 120, such as a nitride or an oxynitride cap, helps to protect the NFET gate 106 during subsequent processing steps.

The PFET device 104 includes a PFET gate 122. Below the PFET gate 122 is a PFET gate oxide 124, and below the PFET gate oxide 124 is a PFET channel 126. Surrounding the PFET gate 122 is a PFET first liner 128, and surrounding the PFET first liner 128 is a PFET first spacer 130. By way of example, the PFET first liner 128 may be made from a material that includes oxygen and the PFET first spacer 130 may be made from a material that includes nitrogen. A PFET source/drain extension 132, formed by a low to medium-dose implant, extends from the PFET channel 126 in the substrate 118 to facilitate dimensional reductions for the scaling of the integrated circuit system 100. A PFET cap 134, such as a nitride or an oxynitride cap, helps to protect the PFET gate 122 during subsequent processing steps.

As is known within the art, the NFET gate 106 and the PFET gate 122 may include any type of conducting material, such as silicon, polysilicon, and/or metal and the NFET gate oxide 108 and the PFET gate oxide 124 may include high-K dielectric constant materials and low-K dielectric constant materials.

An isolation structure 136, such as a shallow trench isolation and/or a field oxide is formed within or on the substrate 118. Furthermore, the substrate 118 may optionally include a strain suppressing feature 138 adjacent the NFET device 102. Generally, the strain suppressing feature 138 is rectangular and parallel to the length of the NFET gate 106. The strain suppressing feature 138 helps to control detrimental strain generated by the isolation structure 136 upon the NFET device 102. Thus, the detrimental strain generated by the isolation structure 136 upon the NFET device 102 can be controlled, adjusted to a predetermined level, and optimized by strategically positioning the strain suppressing feature 138.

For purposes of illustration, the substrate 118 may include semiconductor materials selected from silicon (Si) and/or Germanium (Ge). Furthermore, by way of example, the substrate 118 may include a bulk semiconductor substrate or a silicon-on-insulator substrate.

Figure 2:
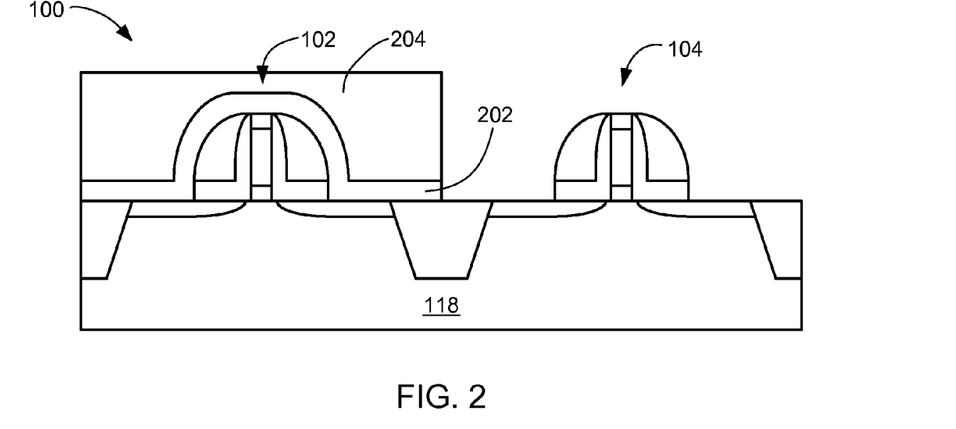
FIG. 2 is the structure of FIG. 1 after the formation of a protective layer and a first mask.

Referring now to FIG. 2, therein is shown the structure of FIG. 1 after the formation of a protective layer 202 and a first mask 204. The protective layer 202, which may include a low temperature oxide layer, is deposited over the integrated circuit system 100. However, it is to be understood that the composition of the protective layer 202 is not critical, what is important is that the protective layer 202 be made from a material that protects the NFET device 102 from damage during subsequent etching of the substrate 118 and/or be made from a material that helps to block the deposition of a subsequent layer, such as a silicon germanium layer.

The first mask 204 is formed over the NFET device 102. The first mask 204 shields the protective layer 202 formed over the NFET device 102 from a subsequent etch step, which removes the protective layer 202 from over the PFET device 104. By way of example, the subsequent etch step may include an oxide wet etch, if the protective layer 202 includes an oxide material. The materials and techniques used to form the first mask 204 are well know in the art and not repeated herein.

Figure 3:
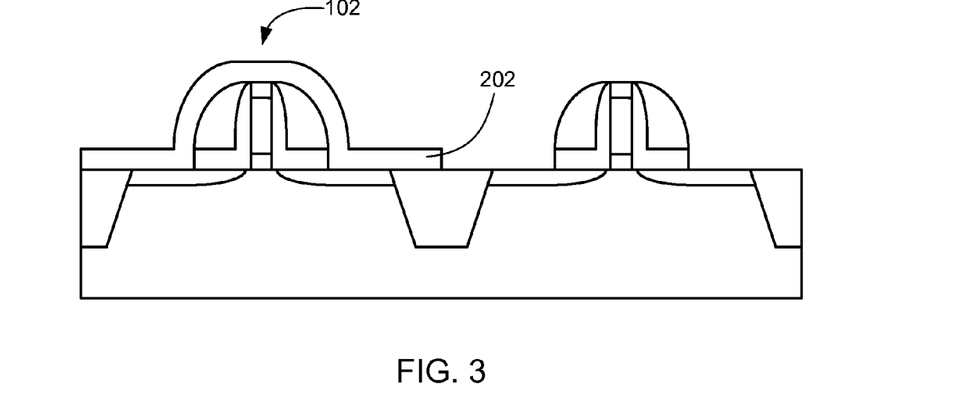
FIG. 3 is the structure of FIG. 2 after removal of a first mask.

Referring now to FIG. 3, therein is shown the structure of FIG. 2 after removal of the first mask 204, of FIG. 2. The first mask 204 is removed from over the NFET device 102, exposing the protective layer 202 formed over the NFET device 102. For purposes of illustration, the first mask 204 may be removed by a plasma or a wet resist strip process.

Figure 4:
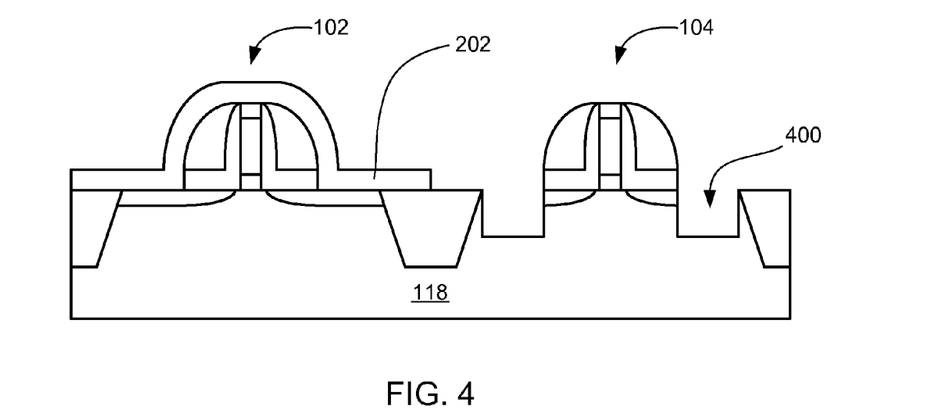
FIG. 4 is the structure of FIG. 3 after formation of a PFET recess in a substrate.

Referring now to FIG. 4, therein is shown the structure of FIG. 3 after formation of a PFET recess 400 in the substrate 118. The PFET recess 400 can be formed by selectively etching portions of the substrate 118 adjacent the PFET device 104. The PFET recess 400 can be formed to a depth of about 150 angstroms to about 1600 angstroms. By way of example, if the substrate 118 is made from silicon, the etching process for forming the PFET recess 400 may employ reactive ion etching or other processes that are highly selective to silicon.

After the etching process, a wet clean step may be employed to remove any residual surface contaminants, such as particles, organics and native oxides. Optionally, the clean step can be in the gaseous form, with mixtures of gases that include HF. The protective layer 202 shields the NFET device 102 from this etching process.

Figure 5:
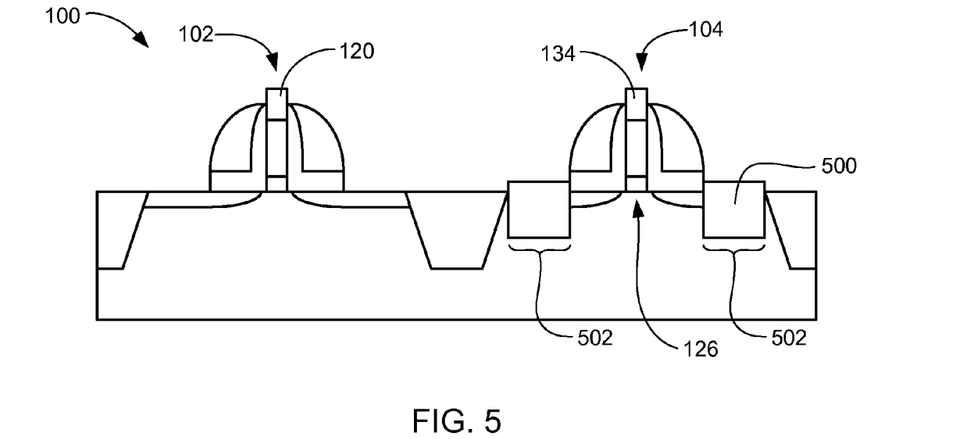
FIG. 5 is the structure of FIG. 4 after formation of a punch-through suppression layer within a PFET source/drain.

Referring now to FIG. 5, therein is shown the structure of FIG. 4 after formation of a punch-through suppression layer 500 within a PFET source/drain 502. By way of example, the punch-through suppression layer 500 can be formed within the PFET recess 400, of FIG. 4, after an epitaxial pre-clean process. The punch-through suppression layer 500 helps to prevent the PFET channel 126 from shorting and causing an undesirable leakage current, which can lead to failure of the integrated circuit system 100. Channel shorting commonly occurs when the drain field extends too far into the channel region and contacts the source, thereby causing punch-through of the majority carriers.

It has been discovered by the present inventors that this channel shorting phenomena can be ameliorated by forming the punch-through suppression layer 500 within the PFET source/drain 502. Generally, the present inventors have discovered that the proximity effect of the punch-through suppression layer 500 can be enhanced by tailoring the PFET source/drain 502 configuration to suppress short channel effects. As is evident from disclosure herein, short channel effects can be minimized by forming the PFET source/drain 502 in a step-shaped configuration.

However, it is to be understood that the PFET source/drain 502 is not to be limited to a particular configuration or depth. In accordance with the present invention, the PFET source/drain 502 may include any configuration and/or depth profile that reduces short channel effects.

Notably, the punch-through suppression layer 500 may also introduce strain within the PFET channel 126, thereby improving the performance of the PFET device 104. It will be appreciated by those skilled in the art that an appropriately applied strain to the channel region of a transistor device may enhance the amount of current that can flow through the device.

By way of example, the present invention may employ the punch-through suppression layer 500 made from materials including silicon germanium, or more specifically, in-situ p-type doped epitaxially grown silicon germanium, to induce strain within the PFET channel 126. By way of example, if the punch-through suppression layer 500 includes a silicon germanium layer then the germanium concentration of the punch-through suppression layer 500 may vary between about 5 to about 45 atomic percent. However it is to be understood that the punch-through suppression layer 500 is not to be limited to any particular type of material. In accordance with the present invention, the punch-through suppression layer 500 may include any material that is engineered to induce strain and suppress short channel effects within the PFET channel 126.

Furthermore, the thickness of the punch-through suppression layer 500 deposited may include any thickness that appropriately alters the strain and/or suppresses the short channel effects within the PFET channel 126.

During deposition of the punch-through suppression layer 500, the protective layer 202, of FIG. 4, may remain over the NFET device 102 to help protect the NFET device 102. After deposition of the punch-through suppression layer 500 the protective layer 202 can be removed. For purposes of illustration, the protective layer 202 can be removed by an oxide etch process. Depending upon the material of the protective layer 202, a portion of the NFET cap 120 and a portion of the PFET cap 134 can be exposed concurrently while etching the protective layer 202 or a portion of the NFET cap 120 and a portion of the PFET cap 134 can be exposed by a subsequent etch process.

Figure 6:
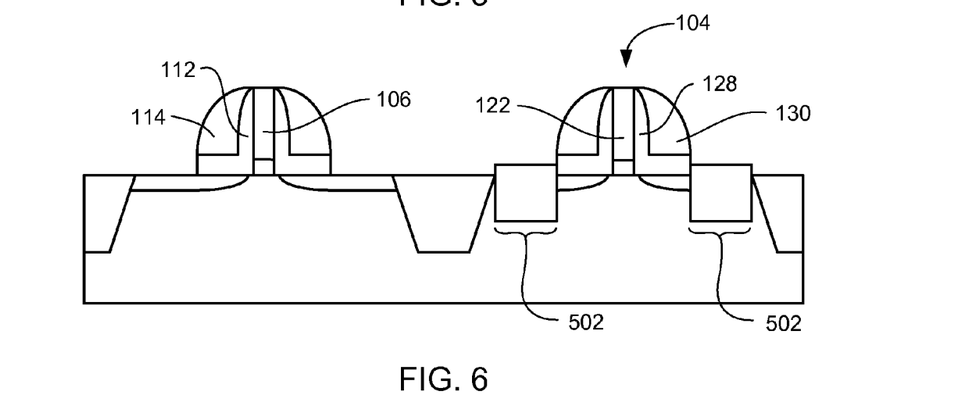
FIG. 6 is the structure of FIG. 5 after further processing.

Referring now to FIG. 6, therein is shown the structure of FIG. 5 after further processing. The NFET cap 120, of FIG. 5, and the PFET cap 134, of FIG. 5, have been removed from over the NFET gate 106 and the PFET gate 122, respectively. Depending upon the materials chosen for the NFET cap 120, the NFET first liner 112, the NFET first spacer 114, the PFET cap 134, the PFET first liner 128, and the PFET first spacer 130, an anisotropic reactive ion etch with a high selectivity of nitride to oxide can be employed to remove the NFET cap 120 and the PFET cap 134. By way of example, an anisotropic reactive ion etch with a high selectivity of nitride to oxide can be employed if the NFET cap 120, the NFET first spacer 114, the PFET cap 134, and the PFET first spacer 130 include nitrogen and the NFET first liner 112 and the PFET first liner 128 include oxygen.

An optional additional p-type dopant implant into the PFET device 104 can be performed to appropriately adjust the PFET source/drain 502 concentration. The p-type dopant may include boron, for example.

Figure 7:
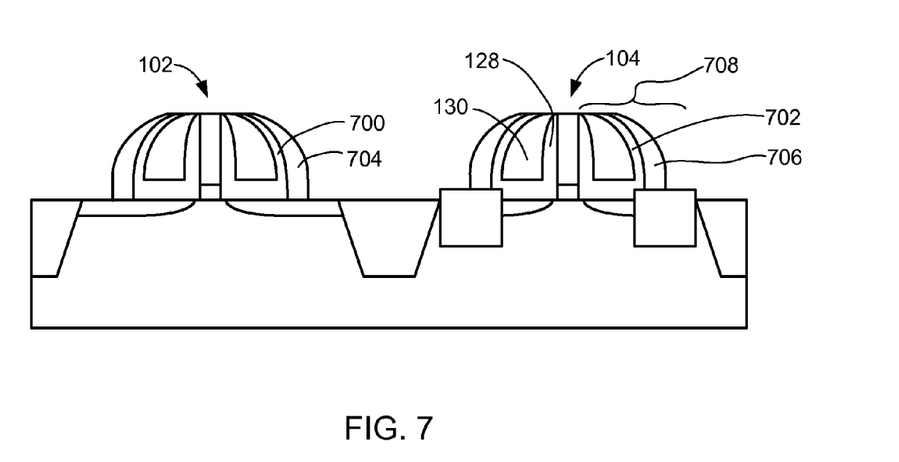
FIG. 7 is the structure of FIG. 6 after formation of an NFET second liner, a PFET second liner, an NFET second spacer, and a PFET second spacer.

Referring now to FIG. 7, therein is shown the structure of FIG. 6 after formation of NFET second liner 700, a PFET second liner 702, an NFET second spacer 704, and a PFET second spacer 706. During this process step the NFET second liner 700 and the PFET second liner 702 are deposited over the NFET device 102 and the PFET device 104, respectively. By way of example, the NFET second liner 700 and the PFET second liner 702 can be formed by blanket deposition followed by a subsequent etch back before or after the NFET second spacer 704 and the PFET second spacer 706 are deposited, or by selective deposition.

Additionally, the NFET second spacer 704 and the PFET second spacer 706 are deposited over the NFET second liner 700 and the PFET second liner 702, respectively. By way of example, the NFET second spacer 704 and the PFET second spacer 706 can be formed by blanket deposition followed by etch back, or by selective deposition.

After deposition of the PFET second liner 702 and the PFET second spacer 706, the PFET first liner 128, the PFET first spacer 130, the PFET second liner 702 and the PFET second spacer 706 can collectively be referred to as a PFET differential spacer 708.

As an exemplary illustration, the NFET second liner 700 and the PFET second liner 702 may include a dielectric material, such as a low temperature oxide deposited material, and the NFET second spacer 704 and the PFET second spacer 706 may include a dielectric material, such as a nitride.

Etching processes, such as a reactive ion etch, can be employed to configure the NFET second spacer 704, the NFET second liner 700, the PFET second spacer 706 and the PFET second liner 702 as desired.

Figure 8:
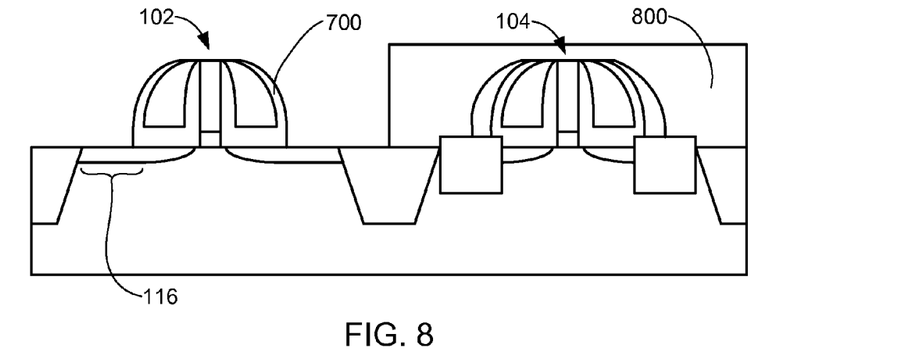
FIG. 8 is the structure of FIG. 7 after removal of an NFET second spacer.

Referring now to FIG. 8, therein is shown the structure of FIG. 7 after removal of the NFET second spacer 704, of FIG. 7. A second mask 800 is formed over the PFET device 104. The second mask 800 shields the PFET device 104 from the subsequent etch removal of the NFET second spacer 704 from over the NFET device 102, or more specifically, from over the NFET second liner 700. Depending upon the material chosen for the NFET second spacer 704, the etch process employed to remove the NFET second spacer 704 may include a nitride isotropic reactive ion etch or a chemical dry etching technique. The materials and techniques used to form the second mask 800 are well know in the art and not repeated herein.

Figure 9:
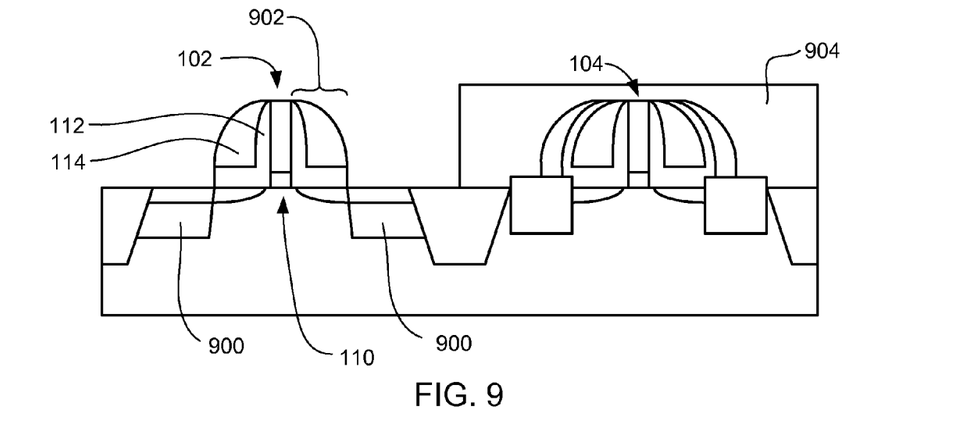
FIG. 9 is the structure of FIG. 8 after removal of an NFET second liner and formation of an NFET source/drain.

Referring now to FIG. 9, therein is shown the structure of FIG. 8 after removal of the NFET second liner 700, of FIG. 8, and formation of an NFET source/drain 900. The second mask 800, of FIG. 8, is removed from over the PFET device 104. As an exemplary illustration, the second mask 800 may be removed by a plasma or a wet resist strip process. The NFET second liner 700 is removed from over the NFET device 102. Depending upon the composition of the NFET second liner 700, an oxide deglaze may also be performed.

After removal of the NFET second liner 700 and the NFET second spacer 704, of FIG. 7, the NFET first liner 112 and the NFET first spacer 114 can collectively be referred to as a NFET differential spacer 902. It can be appreciated by those skilled in the art that the size and/or width of the NFET differential spacer 902 can affect the performance of the NFET device 102 due to its ability to offset a subsequently deposited tensile strained dielectric layer from the NFET channel 110. For example, if the size and/or width of the NFET differential spacer 902 is configured incorrectly (i.e.— too large) then the stress transfer from the subsequently deposited tensile strained dielectric layer will be weakened. Notably, the present invention allows the design engineer to configure the size and/or width of the NFET differential spacer 902 to optimize the tensile stress of a subsequently deposited tensile strained dielectric layer upon the NFET channel 110. As an exemplary illustration, the subsequently deposited tensile strained dielectric layer may include a contact etch stop layer, such as a nitride layer.

A third mask 904 is then formed over the PFET device 104. The third mask 904 protects the PFET device 104 from a subsequent source/drain implant step of the NFET source/drain 900. However, it is not mandatory to remove the second mask 800, of FIG. 8, and then reform the third mask 904. The second mask 800 can be used to block the PFET 104 during the subsequent source/drain implant step of the NFET source/drain 900.

The NFET source/drain 900 is formed adjacent the NFET device 102 by, for example, an n-type dopant implantation step. The NFET source/drain 900 is aligned to the NFET first spacer 114, which remains after the removal of the NFET second liner 700.

Figure 10:
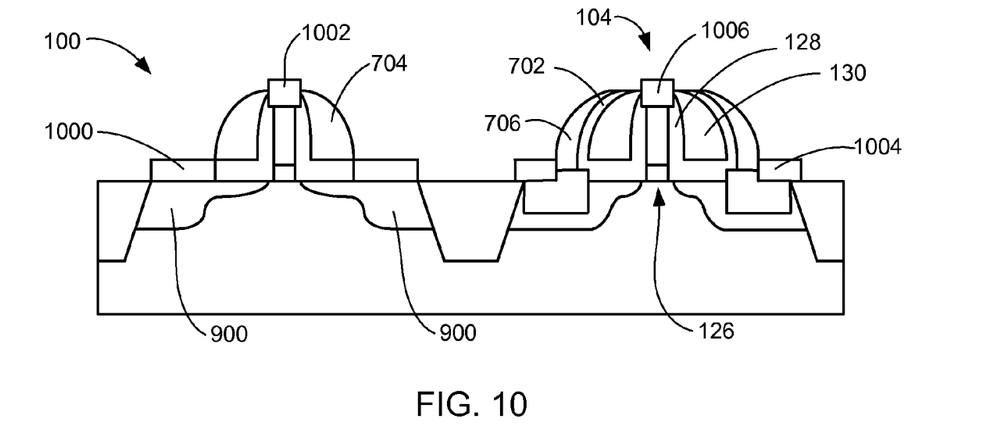
FIG. 10 is the structure of FIG. 9 after further processing.

Referring now to FIG. 10, therein is shown the structure of FIG. 9 after further processing. The third mask 904, of FIG. 9, is removed from over the integrated circuit system 100, thereby exposing the NFET device 102 and the PFET device 104 for further processing.

To improve contact formation with the active areas of the integrated circuit system 100, a silicide or salicide process may be employed to form a low resistivity contact, such as, an NFET source/drain silicide contact 1000, an NFET gate silicide contact 1002, a PFET source/drain silicide contact 1004, and a PFET gate silicide contact 1006. It is to be understood that the low resistivity contact may include any conducting compound that forms an electrical interface between itself and another material that is thermally stable and provides uniform electrical properties with low resistance. For purposes of illustration, the low resistivity contact may include refractory metal materials such as, nickel (Ni), cobalt (Co), titanium (Ti), tungsten (W), platinum (Pt), or nickel platinum (NiPt).

It has been discovered by the present inventors that the performance of the PFET device 104 can be affected by the formation of the PFET source/drain silicide contact 1004. The present inventors have discovered that the PFET source/drain silicide contact 1004 can detrimentally affect the PFET device 104 when it is placed too close to the PFET channel 126. While not wanting to be bound by any particular theory, the present inventors believe that the tensile nature of the PFET source/drain silicide contact 1004 can adversely impact hole mobility within the PFET channel 126. The affect of the PFET source/drain silicide contact 1004 is even more pronounced when the PFET device 104 includes embedded silicon germanium source/drain regions.

Notably, the present invention employs the PFET source/drain silicide contact 1004 displaced from the PFET channel 126 by an amount that is equal to the distance occupied by the PFET first liner 128, the PFET first spacer 130, the PFET second liner 702 and the PFET second spacer 706. By displacing the PFET source/drain silicide contact 1004 by this amount form the PFET channel 126, the detrimental proximity effect of the PFET source/drain silicide contact 1004 can be diminished. Accordingly, it is to be understood that the distance or amount of displacement of the PFET source/drain silicide contact 1004 from the PFET channel 126 will depend upon the design engineers desired strategic reduction of the detrimental proximity effect of the PFET source/drain silicide contact 1004 upon the PFET channel 126. Stated another way, the width of each of the PFET first liner 128, the PFET first spacer 130, the PFET second liner 702 and the PFET second spacer 706 can be determined by the desired amount of reduction in the tensile stress upon the PFET channel 126.

For purposes of illustration, the NFET source/drain silicide contact 1000 and the PFET source/drain silicide contact 1004 can be aligned to the NFET second spacer 704 and the PFET second spacer 706, respectively.

After formation of the NFET source/drain silicide contact 1000, the NFET gate silicide contact 1002, the PFET source/drain silicide contact 1004, and the PFET gate silicide contact 1006, conventional processing steps, such as a spike anneal and deposition of dielectric layers engineered to promote compressive/tensile stain can be performed.

Although the present invention depicts formation of the PFET second liner 702 and the PFET second spacer 706 over the PFET device 104 before formation of the NFET source/drain 900, it is to be understood that this sequence is not essential. In accordance with the scope of the present invention, the PFET second liner 702 and the PFET second spacer 706 need only be formed over the PFET device 104 before formation of the PFET source/drain silicide contact 1004 to help prevent the detrimental proximity effect that the PFET source/drain silicide contact 1004 may have upon the PFET channel 126.

Generally, the following embodiments, described by FIGS. 11-16, manipulate the stresses created within a channel to maximize the performance of both NFET (n-channel Field-Effect-Transistor) and PFET (p-channel Field-Effect-Transistor) configurations through the use of stress engineered spacers. The present inventors have found that stress engineered spacer design can maximize PFET performance by utilizing a relaxed PFET spacer that displaces a silicide electrical contact away from the PFET channel, while enhancing NFET performance by utilizing the proximity effect of a tensile stressed NFET spacer.

FIGS. 11-16, which follow, depict by way of example and not by limitation, an exemplary process flow for the formation of an integrated circuit system and they are not to be construed as limiting. It is to be understood that a plurality of conventional processes that are well known within the art and not repeated herein, may precede or follow FIGS. 11-16. Moreover, it is to be understood that many modifications, additions, and/or omissions may be made to the below described process without departing from the scope or spirit of the claimed subject matter. For example, the below described process may include more, fewer, or other steps.

Additionally, it is to be appreciated that the integrated circuit system of the present disclosure may include any number of multi-electrode devices in which the current flowing between two specified electrodes is controlled or modulated by the voltage applied at a control electrode. Exemplary illustrations may include an n-channel field effect transistor (NFET), a p-channel field effect transistor (PFET), a complementary metal-oxide-silicon (CMOS) configuration, a single-gate transistor, a multi-gate transistor, a fin-FET, or an annular gate transistor. Additionally, it is to be understood that the integrated circuit system of the present disclosure may include any number of resistance devices with varying resistance values formed by strategically altering the process techniques. Furthermore, it is to be understood that one or more of the integrated circuit system could be prepared at one time on a medium, which could be separated into individual or multiple integrated circuit assemblies at a later stage of fabrication.

Figure 11:
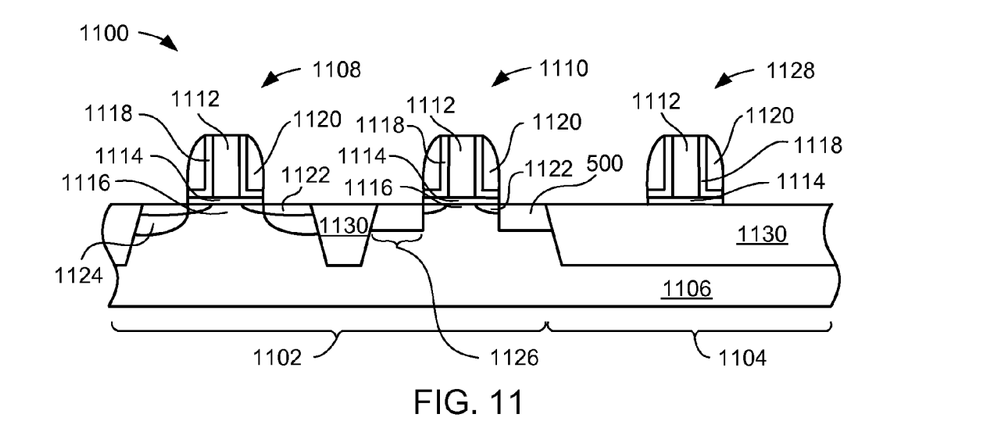
FIG. 11 is a partial cross sectional view of the integrated circuit system in an initial stage of manufacture in accordance with another embodiment of the present invention.

Referring now to FIG. 11, therein is shown a partial cross sectional view of the integrated circuit system 1100 in an initial stage of manufacture in accordance with another embodiment of the present invention. The integrated circuit system 1100 includes a first region 1102 and a second region 1104. In general, the first region 1102 may include active and passive devices and the second region 1104 may include passive devices. In some embodiments, the first region 1102 may include, more particularly, any number of multi-electrode devices in which the current flowing between two specified electrodes is controlled or modulated by the voltage applied at a control electrode and the second region 1104 may include, more particularly, any number of resistance devices with varying resistance values formed by strategically altering the process techniques described herein.

Moreover, it is to be understood that the integrated circuit system 1100 manufactured by the embodiments described herein can be used within a multitude of electronic systems, such as processor components, memory components, logic components, digital components, analog components, mixed-signal components, power components, radio-frequency (RF) components (e.g., RF CMOS circuits), digital signal processor components, micro-electromechanical components, optical sensor components, and so forth, in numerous configurations and arrangements as may be needed.

The first region 1102 and the second region 1104 are formed within or over a substrate 1106. By way of example, the substrate 1106 may include any semiconducting material, such as, Si, SiC, SiGe, Si/SiGe, SiGeC, Ge, GaAs, InAs, InP, other III/V or II/VI compound semiconductors, as well as silicon-on-insulator configurations. Additionally, the substrate 1106 may also include doped and undoped configurations, epitaxial layers, strained configurations, and one or more crystal orientations (e.g.—<100>, <110>, and/or <111> orientations), which may be strategically employed to optimize carrier mobility within NFET and PFET devices. The substrate 1106 may also include any material that becomes amorphous upon implantation.

In some embodiments, the substrate 1106 may possess a thickness ranging from about one hundred (100) nanometers to about several hundred microns, for example.

However, the examples provided for the substrate 1106 are not to be construed as limiting and the composition of the substrate 1106 may include any surface, material, configuration, or thickness that physically and electrically enables the formation of active and/or passive device structures.

A first device 1108 and a second device 1110 can be formed over, on and/or within the substrate 1106 by conventional deposition, patterning, photolithography, and etching techniques known in the semiconductor processing industry for the manufacture of active and/or passive devices. In some embodiments, the first device 1108 and the second device 1110 may include one or more of a PFET device and/or an NFET device. In other embodiments, the first device 1108 and the second device 1110 may include a PFET device and an NFET device cooperatively coupled, thereby forming a CMOS device. In a preferred embodiment, the first device 1108 includes an NFET device and the second device 1110 includes a PFET device.

In general, the first device 1108 and the second device 1110 both include a gate 1112, a gate dielectric 1114, a channel 1116, a first spacer 1118, a second spacer 1120, and a source/drain extension 1122

In some embodiments, the gate 1112 may be formed from conventional materials including doped and undoped semiconducting materials (such as, for example, polySi, amorphous Si, or SiGe), a metal, a metallic alloy, a silicide, or a combination thereof, for example. In other embodiments, the gate 1112 may also include any conducting material or composition that becomes amorphous upon implantation. The gate dielectric 1114 may be made from materials including, but not limited to, silicon oxide, silicon oxynitride, silicon nitride, a silicon oxide/nitride/oxide stack, a high-k dielectric material (i.e., one having a dielectric constant value greater than silicon oxide), or a combination thereof. However, it is to be understood that the type of material chosen for the gate dielectric 1114 is not limited to the above examples; for example, the gate dielectric 1114 may include any material that permits induction of a charge in the channel 1116 when an appropriate voltage is applied to the gate 1112. Accordingly, other materials, which may be known to those skilled in the art for gate structures, may also be used for the gate 1112 and the gate dielectric 1114.

Generally, the thickness of the gate 1112 is between about 500 angstroms and about 3000 angstroms and the thickness of the gate dielectric 1114 is between about 10 angstroms and about 50 angstroms. However, larger or smaller thicknesses of the gate 1112 and the gate dielectric 1114 may be appropriate depending on the design specifications of the first device 1108 and the second device 1110.

The first spacer 1118 may include dielectric materials such as an oxide, a nitride, or a combination thereof, but preferably includes silicon dioxide. The first spacer 1118 can be formed by a variety of techniques, including, but not limited to, physical vapor deposition, chemical vapor deposition and thermal oxidation, followed by an appropriate anisotropic etch.

The second spacer 1120 can be formed adjacent the first spacer 1118 and typically includes a material (e.g., an oxide, a nitride, or a combination thereof) that can be selectively etched with respect to the material of the first spacer 1118. For example, if the first spacer 1118 is formed using silicon dioxide, the second spacer 1120 can be formed using silicon nitride. For such a spacer material composition, a plurality of anisotropic etch recipes with moderately high etch selectivity are well know within the art. The second spacer 1120 can be formed by a variety of techniques, including, but not limited to, chemical vapor deposition and physical vapor deposition, followed by an appropriate anisotropic etch.

However, it is to be understood that the type of materials chosen for the first spacer 1118 and the second spacer 1120 are not limited to the above examples and may include any material that permits electrical isolation of the gate 1112, formation of a lateral dopant profile within the substrate 1106 adjacent the channel 1116, and/or a moderately high etch selectivity between the first spacer 1118 and the second spacer 1120.

Moreover, it is to be understood that the thickness and/or width of each of the first spacer 1118 and the second spacer 1120 may determine, at least in part, the location of a subsequently formed source and drain region. Accordingly, the thickness and/or width of each of the first spacer 1118 and the second spacer 1120 can be altered to meet the design specification (e.g., sub 45 nanometer technology node critical dimensions) of the integrated circuit system 1100.

The first device 1108 and the second device 1110 may also include the source/drain extension 1122 formed adjacent the channel 1116. In general, the source/drain extension 1122 may be formed to a shallow depth with a low concentration of impurities relative to a source and drain region. More specifically, the source/drain extension 1122 can be formed from a dopant implant dose between about $1 \times 10^{14}$ ions/cm$^2$ to about $5 \times 10^{15}$ ions/cm$^2$. However, larger or smaller doses may be used depending upon the impurity used and the design specifications of the first device 1108 and the second device 1110. Moreover, it is to be understood that the above parameter is not limiting and those skilled in the art will appreciate that additional parameters may also be employed/manipulated to effectuate the purpose of implanting a highly-doped and abrupt form of the source/drain extension 1122.

The impurities used to form the source/drain extension 1122 may include n-type or p-type, depending on the first device 1108 and/or the second device 1110 being formed (e.g., n-type impurities for an NMOS device and p-type impurities for a PMOS device). It is to be understood that the source/drain extension 1122 can be formed by aligning the source/drain extension 1122 to the gate 1112 (i.e., before forming the first spacer 1118 and the second spacer 1120) or subsequent to forming the first spacer 1118 and the second spacer 1120 by employing an angled implant.

In some embodiments, a first device source/drain 1124 can be aligned to the second spacer 1120 of the first device 1108. In general, the first device source/drain 1124 may be of the same conductivity type as the dopants used to form the source/drain extension 1122 of the first device 1108 (e.g., n-type impurities for an NFET device or p-type impurities for a PFET device). In a preferred embodiment, the first device source/drain 1124 includes n-type impurities. Exemplary energies and doses used to form the first device source/drain 1124 may include an energy between about 1 keV and about 70 keV and a concentration between about $1 \times 10^{14}$ ions/cm$^2$ to about $5 \times 10^{15}$ ions/cm$^2$. However, larger or smaller energies and doses may be used depending upon the impurity used and the design specifications of the first device 1108. Moreover, it is to be understood that the above parameters are not limiting and those skilled in the art will appreciate that additional parameters may also be employed/manipulated to effectuate the purpose of implanting a highly-doped and abrupt form of the first device source/drain 1124.

In some embodiments a second device source/drain 1126 can be aligned to the second spacer 1120 of the second device 1110. The second device source/drain 1126 may include the punch-through suppression layer 500, wherein the punch-through suppression layer 500 can be made from any material that is engineered to induce stress and suppress short channel effects within the channel 1116 of the second device 1110.

By way of example, the punch-through suppression layer 500 may include an epitaxially grown material that is formed within the second device source/drain 1126 by selective growth methods. As is evident from the disclosure herein, the punch-through suppression layer 500 can be formed via the process steps disclosed above in reference to FIGS. 1-10. In some embodiments, the punch-through suppression layer 500 can be exposed to one or more impurities, such as n-type and/or p-type impurities, during the epitaxial growth process or by a later implantation of impurities, thereby doping the punch-through suppression layer 500. In other embodiments, the punch-through suppression layer 500 may not be doped.

In a preferred embodiment, the punch-through suppression layer 500 may include a p-type doped epitaxially grown silicon germanium material. In such cases, the punch-through suppression layer 500 may include a germanium concentration ranging between about 5 to about 45 atomic percent. It will be appreciated by those skilled in the art that a p-type doped epitaxially grown silicon germanium material can improve the performance of a PFET device. However it is to be understood that the punch-through suppression layer 500 need not be limited to any particular type of material or concentration. In accordance with the present invention, the punch-through suppression layer 500 may include any material that is engineered to induce appropriate stress and suppress short channel effects within the channel 1116 of the second device 1110, while retaining the properties of electrical conductivity.

As such, it will be appreciated by those skilled in the art that an appropriately applied stress to the channel region of a transistor device may enhance the amount of current that can flow through the device. Furthermore, the thickness of the punch-through suppression layer 500 deposited within the second device source/drain 1126 may include any thickness that appropriately alters the stress and/or suppresses the short channel effects within the second device 1110. By way of example, the punch-through suppression layer 500 can be grown to an elevation higher than the upper surface of the substrate 1106.

The integrated circuit system 1100 may also include a resistance device 1128. In some embodiments, the resistance device 1128 can be formed over, on and/or within the substrate 1106 by conventional deposition, patterning, photolithography, and etching techniques known in the semiconductor processing industry for the manufacture of active/passive devices. More specifically, the resistance device 1128 can be formed over an isolation structure 1130, such as a shallow trench isolation structure, which can electrically isolate and/or separate the resistance device 1128 from the first device 1108 and the second device 1110. For purposes of illustration, the isolation structure 1130 may be made from a dielectric material such as silicon dioxide ("$SiO_2$"). In some embodiments, the resistance device 1128 may include one or more of a low, medium or high resistance resistor.

The structure of the resistance device 1128 is substantially similar to the first device 1108 and the second device 1110 and may include the gate 1112, the gate dielectric 1114, the first spacer 1118, and the second spacer 1120, thereby enabling concurrent formation of the resistance device 1128 with the first device 1108 and the second device 1110 on the substrate 1106. It is noted that the layers, structures and process steps corresponding to similar reference numbers generally include the same characteristics (e.g.—composition, thickness, function, process techniques, etc.) as those described above in reference to the first device 1108 and the second device 1110, and therefore, their descriptions are not reiterated in detail.

It is to be understood that the resistance device 1128 operates according to what is conventionally known in the art.

In some embodiments, subsequent to forming the first device 1108, the second device 1110 and the resistance device 1128, an anneal may be performed. It is to be understood that the anneal may include any thermal process that causes electrical activation of the dopants within the first device 1108, the second device 1110 and/or the substrate 1106. As exemplary illustrations, the anneal may include a rapid thermal anneal, a spike anneal, a millisecond anneal, a flash anneal, and/or a laser anneal.

Figure 12:
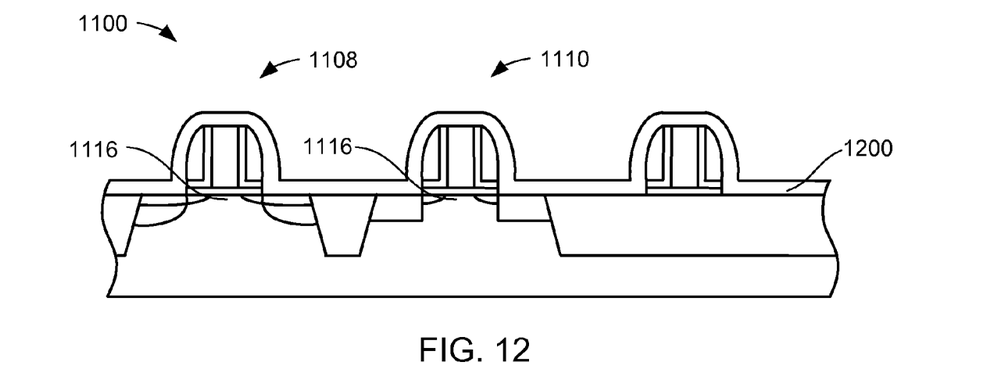
FIG. 12 is the structure of FIG. 11 after forming a stress inducing layer.

Referring now to FIG. 12, therein is shown the structure of FIG. 11 after forming the stress inducing layer 1200. In general, the stress inducing layer 1200 may include a dielectric material with a specified internal stress that can be transferred to either or both of the channel 1116 of the first device 1108 and the second device 1110. In some embodiments, the stress inducing layer 1200 may include a silicon nitride layer with a tensile stress of about 100 MPa to about 2 Gpa. It is to be understood that the specified internal stress within the stress inducing layer 1200 may be selected so as to efficiently produce a corresponding first stress level within the channel 1116 of the first device 1108 in accordance with design and performance requirements of the integrated circuit system 1100. By stress engineering the stress inducing layer 1200 with an appropriate stress, carrier mobility within the channel 1116 of the first device 1108 can be enhanced, thereby improving the performance of the first device 1108.

In some embodiments, the stress inducing layer 1200 can be deposited by plasma enhanced chemical vapor deposition. In such cases, it is to be understood that a multitude of deposition parameters, such as reactant flow rates, pressure, temperature, RF power and frequency, reactant materials, and thickness, can be adjusted to modulate the tensile stress within the stress inducing layer 1200. Moreover, it will be appreciated by those skilled in the art that the above parameters are not limiting and that additional parameters may also be employed and/or manipulated to effectuate the purpose of forming the stress inducing layer 1200 with a specified internal stress that will increase the performance of an active device by enhancing the carrier mobility within the channel region.

In some embodiments, the thickness of the stress inducing layer 1200 may range from about 50 angstroms to about 500 angstroms. However, larger or smaller thicknesses of the stress inducing layer 1200 may be appropriate depending on the design specifications of the first device 1108 and the second device 1110. In other embodiments, the thickness of the stress inducing layer 1200 may depend upon the width of a subsequent spacer to be formed from the stress inducing layer 1200. In yet other embodiments, the thickness of the stress inducing layer 1200 may depend upon its desired stress effect upon the channel 1116 of the first device 1108 and/or the second device 1110.

Moreover, it will be appreciated by those skilled in the art that the proximity of the stress inducing layer 1200 to the channel 1116 can be optimized to increase or reduce its stress inducing effect upon the channel 1116.

Figure 13:
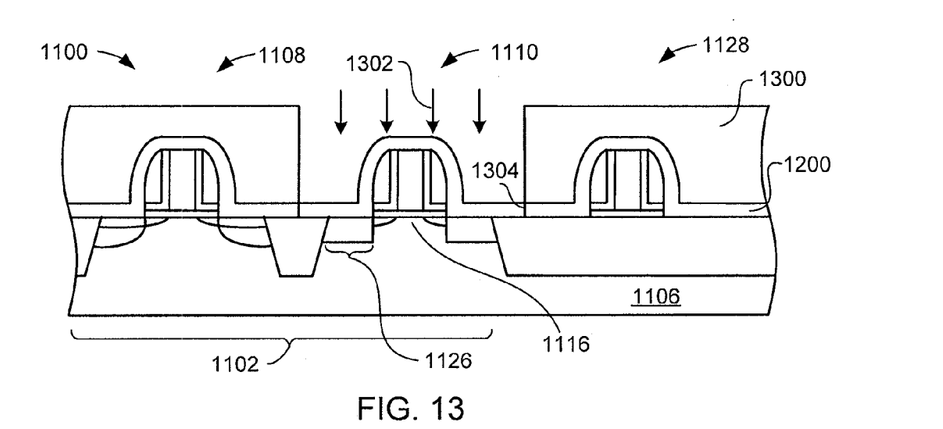
FIG. 13 is the structure of FIG. 12 after processing at least a portion of a stress inducing layer.

Referring now to FIG. 13, therein is shown the structure of FIG. 12 after processing at least a portion of the stress inducing layer 1200. A mask layer 1300 is formed over the integrated circuit system 1100, and is subsequently patterned to form an opening over the first region 1102. In some embodiments, the opening within the mask layer 1300 may expose the second device 1110 (i.e., the first device 1108 and the resistance device 1128 remain covered by the mask layer 1300). The material composition of the mask layer 1300 and the patterning techniques used to form an opening within the mask layer 1300 are well known within the art and not repeated herein.

Subsequent to exposing the first region 1102, at least a portion of the stress inducing layer 1200 formed over the first region 1102 can be processed to alter the stress within the stress inducing layer 1200. In some embodiments, the stress within the stress inducing layer 1200 can be altered by employing a stress altering implant 1302. In such cases, the stress altering implant 1302 can subject at least a portion of the stress inducing layer 1200 formed over the second device 1110, for example, to an implant process that can alter the internal stress within the stress inducing layer 1200. Not wishing to be limited to any particular theories, the present inventors believe that the stress altering implant 1302 can break some of the lattice bonds within the stress inducing layer 1200, thereby altering the internal stress within the stress inducing layer 1200.

For example, in some embodiments, the stress inducing layer 1200 may include a tensile stressed layer, such as a silicon nitride layer, that imparts a tensile stress upon the channel 1116 of the second device 1110. In embodiments where the second device 1110 includes a PFET device, the tensile stress imparted from of the stress inducing layer 1200 upon the second device 1110 can negatively impact the carrier mobility within the channel 1116, thereby degrading device performance. In such cases, the stress altering implant 1302 can be performed upon the exposed portions of the stress inducing layer 1200 formed over the second device 1110 to reduce the internal stress within the stress inducing layer 1200, thus resulting in a reduction of stress upon the channel 1116 of the second device 1110. It is to be understood that the reduction in stress upon the channel 1116 of the second device 1110 occurs by substantially reducing the stress within the stress inducing layer 1200 formed over the second device 1110 due to the stress altering implant 1302.

In some embodiments, the stress altering implant 1302 may include ions such as, germanium (Ge), xenon (Xe), silicon (Si), and/or argon (Ar). However, it is to be understood that the stress altering implant 1302 is not limited to the above examples, and may include any ion implant species that is known to appropriately reduce the internal stress within the stress inducing layer 1200. It will be appreciated by those skilled in the art that the ion implant species for the stress altering implant 1302 may also be chosen so as to minimize any potential negative impact upon the performance of the first device 1108 or the second device 1110.

In some embodiments, the implant dose and implant energy of the stress altering implant 1302 are optimized so that the ions end up only within the stress inducing layer 1200. Notably, the present inventors have discovered that if the stress altering implant 1302 is allowed to penetrate through the stress inducing layer 1200 into the second device 1110, then the dopant within the second device source/drain 1126 can become deactivated, thereby increasing the incidence of device performance degradation.

Accordingly, it is to be understood that a multitude of implantation parameters, such as implant dose and implant energy, can be adjusted to modulate the projected range of the ions to end up only within the stress inducing layer 1200. For example, in some embodiments, the stress altering implant 1302 may include an implant dose of about $1 \times 10^{14}$ to about $1 \times 10^{16}$ ions/cm$^2$ at an implant energy of about 10 keV to about 100 keV. However, larger or smaller doses and energies may be appropriate depending on, for example, the thickness of the stress inducing layer 1200 and the ion species employed. Moreover, it is to be understood that the above parameters are not limiting and those skilled in the art will appreciate that additional parameters may also be employed/manipulated to effectuate the purpose of locating the stress altering implant 1302 species only within the stress inducing layer 1200 and/or modifying (e.g., reducing) the stress within the stress inducing layer 1200.

As an exemplary illustration, the stress inducing layer 1200 may possess a first internal stress of about 100 MPa to about 2 GPa before the stress altering implant 1302, and after the stress altering implant 1302, the portion of the stress inducing layer 1200 subjected to the stress altering implant 1302 may possess a second internal stress of about 0 (zero) MPa to about 100 MPa.

Notably, an interface 1304 demarcates a region wherein the stress within the stress inducing layer 1200 changes (e.g., due to the stress altering implant 1302). It is to be understood that the proximity of the interface 1304 to either of the first device 1108 and/or the second device 1110 can be modulated to enhance performance of the integrated circuit system 1100.

Figure 14:
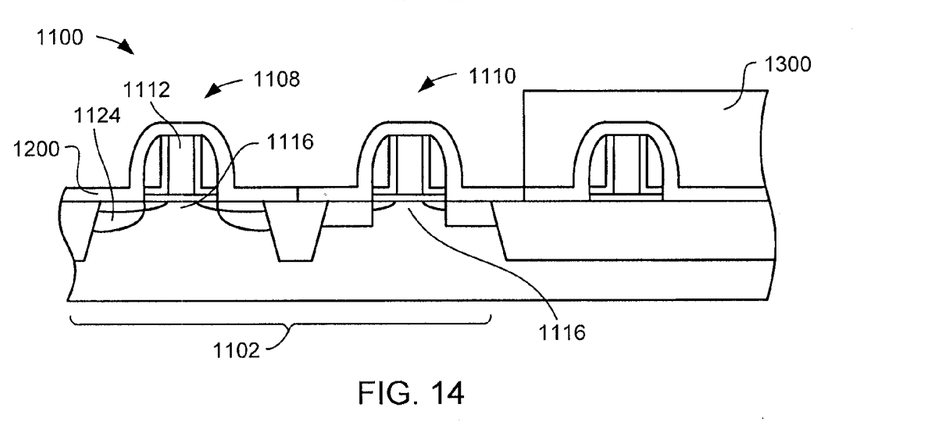
FIG. 14 is the structure of FIG. 13 after further processing.

Referring now to FIG. 14, therein is shown the structure of FIG. 13 after further processing. In some embodiments, the remaining portions of the mask layer 1300 formed over the first region 1102 can be removed by process techniques well known within the art and not repeated herein. Subsequent to removing the mask layer 1300 from over the first region 1102, the first device 1108 and the second device 1110 are exposed for further processing. In other embodiments, the mask layer 1300 can be removed entirely and a new mask layer can be deposited in its place only covering regions not to be subjected to the formation of a low resistance electrical contact.

Notably, in some embodiments, the stress inducing layer 1200 formed over the first device 1108 may posses a first stress (e.g., a tensile stress) that can enhance carrier mobility within the channel 1116 of the first device 1108, while the stress inducing layer 1200 formed over the second device 1110 may posses a second stress (e.g., a relaxed tensile stress) that is less than the first stress exhibited by the stress inducing layer 1200 formed over the first device 1108. It is to be understood that the relaxed tensile stress state of the stress inducing layer 1200 formed over the second device 1110 results in a reduction of stress upon the channel 1116 of the second device 1110, thereby eliminating potential degradation of carrier mobility by the stress inducing layer 1200 formed over the second device 1110.

Figure 15:
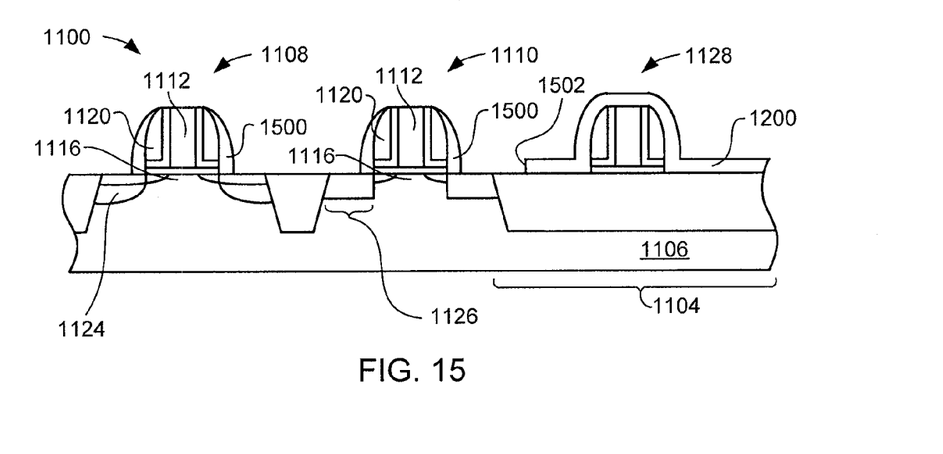
FIG. 15 is the structure of FIG. 14 after forming a third spacer.

Referring now to FIG. 15, therein is shown the structure of FIG. 14 after forming a third spacer 1500. The third spacer 1500 can be formed adjacent the second spacer 1120 of both of the first device 1108 and the second device 1110. It is to be understood that the third spacer 1500 can be formed by an appropriate anisotropic etch process that removes material of the stress inducing layer 1200 from over horizontal portions of the substrate 1106 and the top of the first device 1108 and the second device 1110, thereby exposing the gate 1112 of the first device 1108 and the second device 1110.

In general, after forming the third spacer 1500, the channel 1116 of the first device 1108 may include a first stress level and the channel 1116 of the second device 1110 may include a second stress level, wherein the first stress level is different from the second stress level. It is to be understood that the stress within the third spacer 1500 affects the first stress level within the first device 1108 and the second stress level within the second device 1110. Accordingly, it is to be understood that the stress within the third spacer 1500 can be modulated to enhance device performance characteristics by improving carrier mobility within the channel 1116 of each device.

In some embodiments, the second stress level within the channel 1116 of the second device 1110 has been adjusted to a lower value relative to the first stress level within the channel 1116 of the first device 1108 by performing the stress altering implant 1302, of FIG. 13, and by forming the third spacer 1500. In cases wherein the first device 1108 includes an NFET device and the second device 1110 includes a PFET device, the second stress level is typically less than or substantially less than the first stress level. In such cases, the third spacer 1500 formed adjacent the second spacer 1120 of the first device 1108 may possess a tensile stress (e.g., a tensile stress that is substantially equivalent to the stress within the stress inducing layer 1200 as originally deposited) and the third spacer 1500 formed adjacent the second spacer 1120 of the second device 1110 can possess a relaxed tensile stress state that is less than or substantially less than the tensile stress state of the third spacer 1500 of the first device 1108.

In some embodiments, the width of the third spacer 1500 may be different for each of the first device 1108 and the second device 1110. In other embodiments, the width of the third spacer 1500 may be substantially equivalent for each of the first device 1108 and the second device 1110. In yet other embodiments, the width of the third spacer 1500 may be determined independently for each of the first device 1108 and the second device 1110 based upon, inter alia, the stress transference effect of the third spacer 1500 and/or the offset of a subsequently deposited low resistance electrical contact over the first device source/drain 1124 and the second device source/drain 1126.

As an exemplary illustration, the third spacer 1500 may include a thickness ranging from about 50 angstroms to about 500 angstroms at its interface with the substrate 1106. However, it is to be understood that the thickness of the third spacer 1500 may include any thickness that is optimized to strategically alter the first stress level of the first device 1108 and the second stress level of the second device 1110.

Subsequent to forming the third spacer 1500, the remaining portions of the mask layer 1300, of FIG. 14, are removed from over the resistance device 1128. The process techniques used to remove the mask layer 1300 are well known within the art and not repeated herein.

Notably, the stress inducing layer 1200 remains over the resistance device 1128, thereby preventing/blocking the deposition of a subsequently formed low resistance electrical contact. In at least one embodiment, the portion of the stress inducing layer 1200 remaining over the second region 1104, e.g., formed over the resistance device 1128 and the isolation structure 1130, can include the stress altered form of the interface 1304, of FIG. 13, formed between the second device 1110 and the resistance device 1128 as a stress altered section or boundary 1502.

Figure 16:
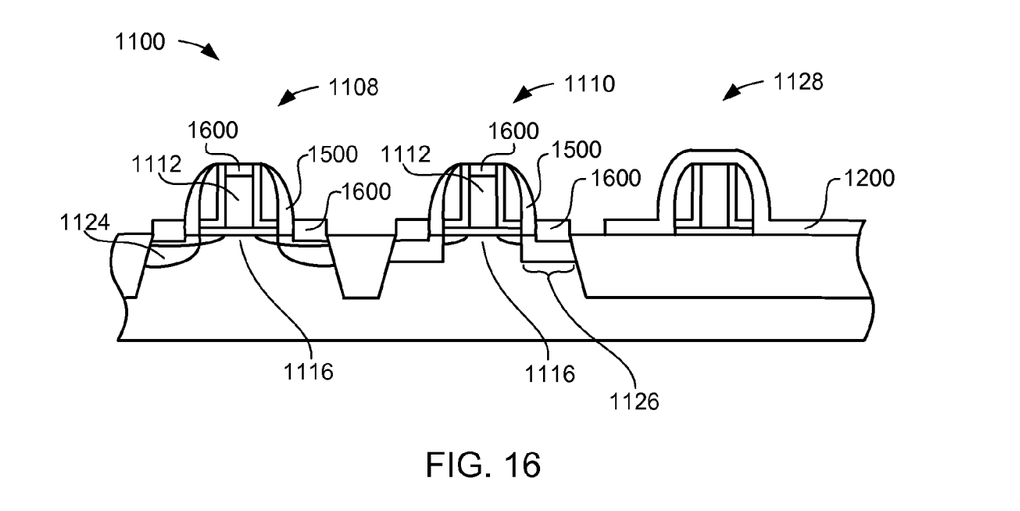
FIG. 16 is the structure of FIG. 15 after forming an electrical contact.

Referring now to FIG. 16, therein is shown the structure of FIG. 15 after forming an electrical contact 1600. Subsequent to forming the third spacer 1500, the electrical contact 1600, such as a low resistance silicide or salicide electrical contact, can be formed over the gate 1112 and adjacent the third spacer 1500 (e.g., over a portion of the first device source/drain 1124 and the second device source/drain 1126) of the first device 1108 and the second device 1110. Notably, the stress inducing layer 1200 formed over the resistance device 1128 blocks the deposition of the electrical contact 1600 form being formed over the resistance device 1128.

In some embodiments, the electrical contact 1600 may include any conducting compound that forms an electrical interface between itself and another material that is thermally stable and provides uniform electrical properties with low resistance. In other embodiments, the electrical contact 1600 may include refractory metal materials such as, tantalum (Ta), cobalt (Co), titanium (Ti), tungsten (W), platinum (Pt), or molybdenum (Mo). In yet other embodiments, the electrical contact 1600 formed over a portion of the first device source/drain 1124 and the second device source/drain 1126 can be aligned to the third spacer 1500 via a salicide process.

It will be appreciated by those skilled in the art that the electrical contact 1600 can affect the mobility of carriers (e.g., due to stresses imparted by the electrical contact 1600) within the channel 1116 of either the first device 1108 or the second device 1110. For example, in cases where the second device 1110 includes a PFET device, if the electrical contact 1600 is placed too close to the channel 1116 of the second device 1110, the electrical contact 1600 can detrimentally affect the mobility of carriers within the channel 1116. As such, it is to be understood that the thickness of the third spacer 1500 can be modulated (e.g., by increasing the thickness) to reduce or negate the detrimental effect that the electrical contact 1600 can have on carrier mobility within the channel 1116 of the second device 1110. Alternatively, the thickness of the third spacer 1500 can also be modulated (e.g., by decreasing the thickness) to enhance the effect that the electrical contact 1600 can have on carrier mobility within the channel 1116 of the first device 1108. Accordingly, the thickness of the third spacer 1500 can be modulated to enhance or reduce the effects that the electrical contact 1600 could have on the first stress level within the first device 1108 and the second stress level within the second device 1110.

Additionally, it will be appreciated by those skilled in the art that other stress engineered layers can be deposited over the integrated circuit system 1100 for purposes of exerting additional stresses upon each of the channel 1116. In such cases, the additional stress engineered layers can be strategically designed and deposited to exert compressive and/or tensile stresses, depending upon the type of device (e.g., tensile for NFET and compressive for PFET).

Furthermore, it is to be understood that the integrated circuit system 1100 may undergo a cleaning step to remove surface contaminants, such as particles, mobile ionic contaminants, organics and native oxides, before formation of the electrical contact 1600. Moreover, it will be appreciated by those skilled in the art that the remainder of the integrated circuit system 1100 can then be completed by conventional transistor and/or CMOS process steps.

Figure 17:
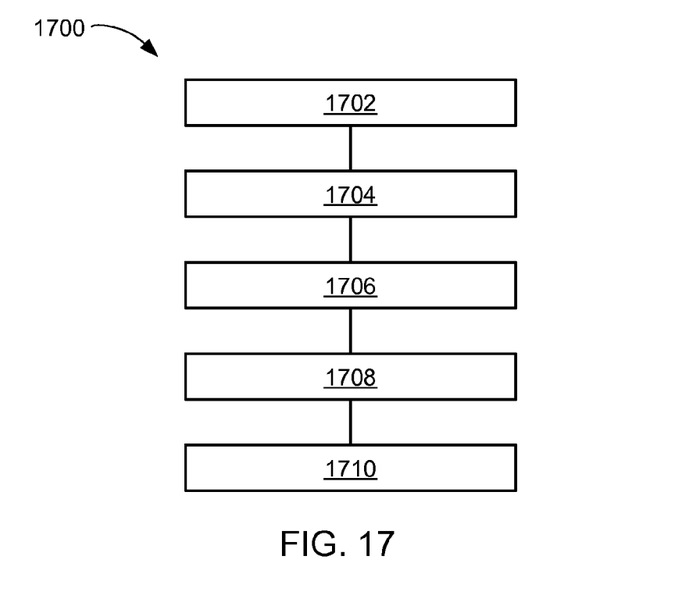
FIG. 17 is a flow chart of an integrated circuit system for an integrated circuit system in accordance with an embodiment of the present invention.

Referring now to FIG. 17, therein is shown a flow chart of an integrated circuit system 1700 for the integrated circuit system 1100 in accordance with an embodiment of the present invention. The integrated circuit system 1700 includes providing a substrate including a first region with a first device and a second device and a second region with a resistance device in a block 1702; configuring the first device, the second device, and the resistance device to include a first spacer and a second spacer in a block 1704; forming a stress inducing layer over the first region and the second region in a block 1706; processing at least a portion of the stress inducing layer formed over the first region to alter the stress within the stress inducing layer in a block 1708; and forming a third spacer adjacent the second spacer of the first device and the second device from the stress inducing layer in a block 1710.

It has been discovered that the present invention thus has numerous aspects. One such aspect is that the present invention helps to reduce the detrimental proximity effect of a silicide contact formed over the PFET source/drain region. The present invention achieves this objective by displacing the PFET source/drain silicide contact from the PFET channel by an amount substantially equal to the width of the PFET first liner, the PFET first spacer, the PFET second liner, and the PFET second spacer.

Another aspect of the present invention is that a silicon germanium punch-through suppression layer can induce compressive strain/stress in the PFET channel, and if the PFET source/drain silicide contact is tensile in nature (for example, NiSi) it will reduce the effective stress induced by the SiGe PFET S/D.

Another aspect of the present invention is that it provides an NFET differential spacer configured to increase tensile strain within an NFET channel. The present invention achieves this objective by configuring an NFET differential spacer to allow a tensile strained dielectric layer in close proximity to the NFET channel.

Another aspect of the present invention is that it provides a punch-through suppression layer that helps to suppress short channel effects associated with dimensional scaling of a PFET device by configuring the PFET source/drain to suppress punch-through occurrences.

Another aspect of the present invention is that it provides increased strain within the PFET channel by depositing a punch-through suppression layer adjacent the PFET channel. For example, a silicon germanium punch-through suppression layer can induce compressive strain/stress in the PFET channel.

Another aspect of the present invention is that a third spacer can be strategically engineered to impart a first stress level to a first device while imparting a second stress level to a second device, wherein the first stress level is different from the second stress level.

Another aspect of the present invention is that a third spacer can be strategically engineered to exert a tensile stress upon an NFET device.

Another aspect of the present invention is that a stress altering implant can be employed to modulate the stress level within a third spacer.

Yet another important aspect of the present invention is that it valuably supports and services the historical trend of reducing costs, simplifying systems, and increasing performance.

These and other valuable aspects of the present invention consequently further the state of the technology to at least the next level.

Thus, it has been discovered that the integrated circuit system of the present invention furnishes important and heretofore unknown and unavailable solutions, capabilities, and functional aspects for enhancing NFET and PFET device performance. The resulting processes and configurations are straightforward, cost-effective, uncomplicated, highly versatile and effective, can be implemented by adapting known technologies, and are thus readily suited for efficiently and economically manufacturing integrated circuit package devices.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations, which fall within the scope of the included claims. All matters hithertofore set forth herein or shown in the accompanying drawings are to be interpreted in an illustrative and non-limiting sense.

What is claimed is:

1. A method for manufacturing an integrated circuit system comprising:
providing a substrate including a first region with a first device and a second device and a second region with a resistor device;
configuring each of the first device, the second device, and the resistor device to include a gate, a gate dielectric, a first spacer and a second spacer;
forming a stress inducing layer over the first region and the second region;
processing at least a portion of the stress inducing layer formed over the first region to alter the stress within the stress inducing layer; and
forming a third spacer adjacent the second spacer of the first device and the second device from the stress inducing layer, the stress inducing layer including a portion remaining over the second region with a stress altered boundary between the second device and the resistor device.

2. The method as claimed in claim 1 wherein:
providing the first device includes providing an NFET device and providing the second device includes providing a PFET device.

3. The method as claimed in claim 1 wherein:
forming the stress inducing layer includes forming a tensile stressed layer.

4. The method as claimed in claim 1 wherein:
processing at least a portion of the stress inducing layer includes implanting germanium or xenon.

5. The method as claimed in claim 1 wherein:
forming the third spacer creates a first stress level in the first device and a second stress level in the second device, the first stress level differing from the second stress level.

6. A method for manufacturing an integrated circuit system comprising:
providing a substrate including a first region with a first device and a second device and a second region with a resistor device;
configuring each of the first device, the second device, and the resistor device to include a gate, a gate dielectric, a first spacer and a second spacer;
forming a stress inducing layer over the first region and the second region;
processing at least a portion of the stress inducing layer formed over the second device to alter the stress within the stress inducing layer; and
forming a third spacer from the stress inducing layer to create a first stress level in the first device and a second stress level in the second device, the first stress level differing from the second stress level and a portion of the stress inducing layer remaining over the second region with a stress altered boundary between the second device and the resistor device.

7. The method as claimed in claim 6 wherein:
forming the third spacer to create the first stress level within the first device includes adjusting the thickness of the third spacer adjacent the first device.

8. The method as claimed in claim 6 wherein:
forming the third spacer to create the second stress level within the second device includes adjusting the thickness of the third spacer adjacent the second device.

9. The method as claimed in claim 6 further comprising:
configuring the second device to include a punch-through suppression layer within a second device source/drain.

10. The method as claimed in claim 6 further comprising:
forming an electrical contact adjacent the third spacer of the first device and the second device.

* * * * *